(12) United States Patent
Shirani et al.

(10) Patent No.: US 7,532,048 B1
(45) Date of Patent: May 12, 2009

(54) MULTI-LEVEL VARIABLE-RESISTOR LINE DRIVER

(75) Inventors: Ramin Shirani, Morgan Hill, CA (US); Ramin Farjadrad, Los Altos, CA (US)

(73) Assignee: Aquantia Corporation, Milpitas, CA (US)

( * ) Notice: Subject to any disclaimer, the term of this patent is extended or adjusted under 35 U.S.C. 154(b) by 0 days.

(21) Appl. No.: 11/738,864

(22) Filed: Apr. 23, 2007

Related U.S. Application Data

(63) Continuation-in-part of application No. 10/993,107, filed on Nov. 18, 2004, now Pat. No. 7,221,196.

(51) Int. Cl.
*H03K 3/00* (2006.01)
(52) U.S. Cl. ............... 327/108; 327/112; 327/423
(58) Field of Classification Search ............... 327/108, 327/110, 112, 423, 487
See application file for complete search history.

(56) References Cited

U.S. PATENT DOCUMENTS

| | | | |
|---|---|---|---|
| 5,818,629 A | 10/1998 | Kinoshita | |
| 5,977,796 A * | 11/1999 | Gabara | 326/86 |
| 6,157,215 A | 12/2000 | Gabara et al. | |
| 6,204,692 B1 | 3/2001 | Nakagawa | |
| 6,351,185 B1 | 2/2002 | Amrany et al. | |
| 6,448,815 B1 | 9/2002 | Talbot et al. | |
| 6,586,964 B1 * | 7/2003 | Kent et al. | 326/30 |
| 6,741,095 B2 | 5/2004 | Abrosimov et al. | |
| 6,751,782 B2 | 6/2004 | Levin et al. | |
| 6,762,896 B2 | 7/2004 | Yoshizawa et al. | |
| 6,771,097 B1 | 8/2004 | Poh Ho et al. | |
| 6,859,064 B1 * | 2/2005 | Maangat | 326/30 |
| 6,940,303 B2 * | 9/2005 | Vargas | 326/30 |
| 6,943,588 B1 * | 9/2005 | Luo et al. | 326/86 |
| 7,221,196 B2 * | 5/2007 | Shirani | 327/112 |
| 7,307,458 B1 * | 12/2007 | Segervall et al. | 327/108 |
| 2004/0264267 A1 | 12/2004 | Nishio et al. | |
| 2006/0006912 A1 | 1/2006 | Leonowich et al. | |

OTHER PUBLICATIONS

Gabara et al., "Digitally Adjustable Resistors in CMOS for High Performance Applications" IEEE Journal of Solid State Circuits, vol. 27, No. 8, Aug. 1992, pp. 1176-1185.
Office Action mailed May 16, 2008 for U.S. Appl. No. 11/198,070, 17 pages.
Response of Sep. 16, 2008 to Office Action of May 16, 2008 for U.S. Appl. No. 11/198,070, 11 pages.

* cited by examiner

*Primary Examiner*—Lincoln Donovan
*Assistant Examiner*—Thomas J Hiltunen
(74) *Attorney, Agent, or Firm*—Sawyer Law Group LLP

(57) ABSTRACT

The line driver circuit is provided that includes a first pull-up variable resistor connected between a first power supply and the first output terminal, a second pull-up variable resistor connected between the first power supply and the second output terminal, a first pull-down variable resistor connected between a second power supply and the first output terminal, a second pull-down variable resistor connected between the second power supply and the second output terminal, a floating variable resistor connected between the first output terminal and the second output terminal, and coder logic to adjust an output voltage across the first output terminal and the second output terminal by varying a resistance of one or more of the floating variable resistor, the first pull-up variable resistor, the second pull-up variable resistor, the first pull-down variable resistor, and the second pull-down variable resistor in response to received data bits.

18 Claims, 4 Drawing Sheets

PRIOR ART

PRIOR ART

MULTI-LEVEL VARIABLE-RESISTOR LINE DRIVER

CROSS-REFERENCE TO RELATED APPLICATIONS

This application is a continuation-in-part of application Ser. No. 10/993,107, now U.S. Pat. No. 7,221,196, filed Nov. 18, 2004, the entire contents of which are incorporated by reference herein.

FIELD OF THE INVENTION

The present invention relates generally to the field of communication, and in particular to line drivers utilized for communications.

BACKGROUND OF THE INVENTION

Communication links generally require a driver to transmit information into the channel from transmitter to receiver. In wireline communications, line drivers typically must satisfy two requirements: first line drivers must generate a certain voltage swing across the transmission line, and second line drivers must have an output impedance that is matched to the line characteristic impedance to absorb signals arriving at the transmitter and avoid reflections back to the line. In digital data transmission, information is sent using different modulations. One of the most common types of data modulation is pulse amplitude modulation (PAM), where each group of data bits are presented by a voltage level that is transmitted into the channel. Data modems and 100Base-T/1000Base-T Ethernet transceivers are examples of links that use multi-level signaling or PAM to transmit information. Information typically needs to be transmitted over distant and lossy channels. To ensure a minimum signal level at the receive end, a line driver must generate a high enough signal power at the transmit end. As a result, the power efficiency of line drivers in most communication links is of great importance, since significant portion of transceiver power is typically burned in the line driver and in circuitry related to the line driver.

FIG. 1 shows an example of a conventional commonly-used differential line driver 10, also known as common-source or common-emitter stage. The line driver 10 comprises a tail current source 12 and a pair of switches 14a and 14b that steer current from one branch to the other. Each branch of the driver is respectively terminated to a voltage source 16 by fixed resistors 18a and 18b that are each matched to the line single-ended characteristic impedance (or half its differential impedance). The effective impedance at the output of the driver is fixed and equal to the parallel resistance of the termination impedance and line single-ended impedance (i.e., $Z_o/2 \| Z_o/2 = Z_o/4$). The amplitude of the output signal is controlled by the amount of the current steered into either of the equivalent parallel resistors, being $Z_o/4$. Accordingly, for the conventional driver to deliver a max swing of 1V (or 2V differential peak-to-peak) into the line, the driver current is high due to the high single-ended impedance.

FIG. 2 illustrates another example of a line driver 20 having an H-bridge topology 20. The line driver 20 differs from the conventional driver 10 of FIG. 1 in that the line driver 20 includes current steering branches 22a and 22b both at the bottom and top, respectively, and has a single termination resistor 24 equal to line impedance across outputs nodes of the line driver. Thus, the bottom current steering branches 22a respectively pulls the same current that the top current steering branches 22b push into the equivalent line and termination impedance (i.e., $Z_o \| Z_o = Z_o/2$), theoretically resulting in twice the current efficiency of the conventional driver 10 of FIG. 1. However, in the H-bridge design to keep the current sources in saturation, such a design requires twice the headroom of a conventional source-coupled design for the current source devices, which typically requires a higher supply voltage.

A design that solves the headroom problem of an H-bridge topology is disclosed in U.S. Pat. No. 6,175,255, entitled "Line Driver Circuit for Low Voltage and Low Power Applications", by Jidentra (shown in FIG. 3). In the line driver topology of FIG. 3, the top current sources are removed and only the top switches that do not have a headroom requirement are left in the top branches. As shown in the waveforms in FIG. 3, the top voltage level of the stage output is in fact a supply voltage, and thus leaving enough voltage headroom for the bottom current sources. However, during a rise period in which one of the top switches is shorted, a resistance at the rising output node VOP or $V_{on}$ becomes very low. Thus, the RC time constant of the rising node gets very low, resulting in a very fast transition. The falling node, where the switch is off, has an effective impedance of the termination resistor $R_t$ parallel with line impedance $Z_o$, thus experiencing a considerably larger time constant than the rising node. This difference in the time constants on the two output nodes results in a rather large output common-mode voltage. Common-mode voltage is not desirable in most wireline applications, especially Ethernet over unshielded twisted pair, as a large output common-mode voltage causes the wire to radiate electromagnetic waves and causes interference that may violate FCC regulations. To avoid this common-mode effect, a transformer must typically be used to cancel the common-mode component of the transmitted signal. The requirement for a transformer makes the solution more expensive and less desirable especially for very high speed applications as the transformer cost also goes up with the frequency of operation.

SUMMARY OF THE INVENTION

In general, in one aspect, this specification describes a line driver circuit including a first output terminal and a second output terminal. In particular, the line driver circuit includes a first pull-up variable resistor and a first switch connected in series between a first power supply and the first output terminal; a second pull-up variable resistor and a second switch connected in series between the first power supply and the second output terminal; a first pull-down variable resistor and a third switch connected in series between a second power supply and the first output terminal; a second pull-down variable resistor and a fourth switch connected in series between the second power supply and the second output terminal; a floating variable resistor connected between the first output terminal and the second output terminal; and coder logic to receive data bits and adjust an output voltage across the first output terminal and the second output terminal by varying a resistance of one or more of the floating variable resistor. The first pull-up variable resistor, the second pull-up variable resistor, the first pull-down variable resistor, and the second pull-down variable resistor responsive to the received data bits.

In general, in another aspect, this specification describes a line driver circuit including a first output terminal and a second output terminal. Specifically, the line driver circuit includes a first switch connected between a first power supply and a first node; a second switch connected between the first power supply and a second node; a third switch connected between the first node and a second power supply; a fourth switch connected between the second node and the second power supply; a first variable resistor connected between the first node and the first output terminal; a second variable resistor connected between the second node and the second output terminal; a floating variable resistor connected between the first output terminal and the second output terminal; and coder logic to receive data bits and adjust an output voltage across the first output terminal and the second output terminal by varying a resistance of one or more of the floating variable resistor. The first variable resistor, and the second variable resistor are responsive to the received data bits.

A low-power multi-level pulse amplitude modulation (PAM) line driver using variable resistors is disclosed for transmitting digital data over controlled-impedance transmission lines. The driver comprises two push-pull variable resistors branches, and a middle variable resistor branch. In one implementation, the purpose of the two push-pull branches is to generate the target voltage level onto the line, and the middle branch ensures that at all times the effective parallel impedance of the resistors matches to the line impedance. The values of the variable resistors can be selected by a driver code logic whose input comprises sets of raw data bits. Each set of raw data bits can be converted to a specific analog voltage level by a driver. In one implementation, the driver requires a supply voltage that is equal or higher than twice the absolute maximum output signal level. This supply voltage can be the supply voltage supplied to the chip itself or a regulated supply voltage that is adjusted to provide a pre-determined voltage swing.

In one aspect, this specification discloses the design of a multi-level PAM driver for high-speed wireline communication, with up to four times improvement in power efficiency over conventional drivers. In one implementation, the high-speed line drivers first generate the target voltage level onto a controlled-impedance line, and are impedance-matched to the line in order to eliminate signal reflections from a transmitter back into the line.

The details of one or more implementations are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF THE INVENTION

The present invention relates generally to the field of communications, and in particular to line drivers utilized for communications. The following description is presented to enable one of ordinary skill in the art to make and use the invention and is provided in the context of a patent application and its requirements. The present invention is not intended to be limited to the implementations shown but is to be accorded the widest scope consistent with the principles and features described herein.

Figure 4A:
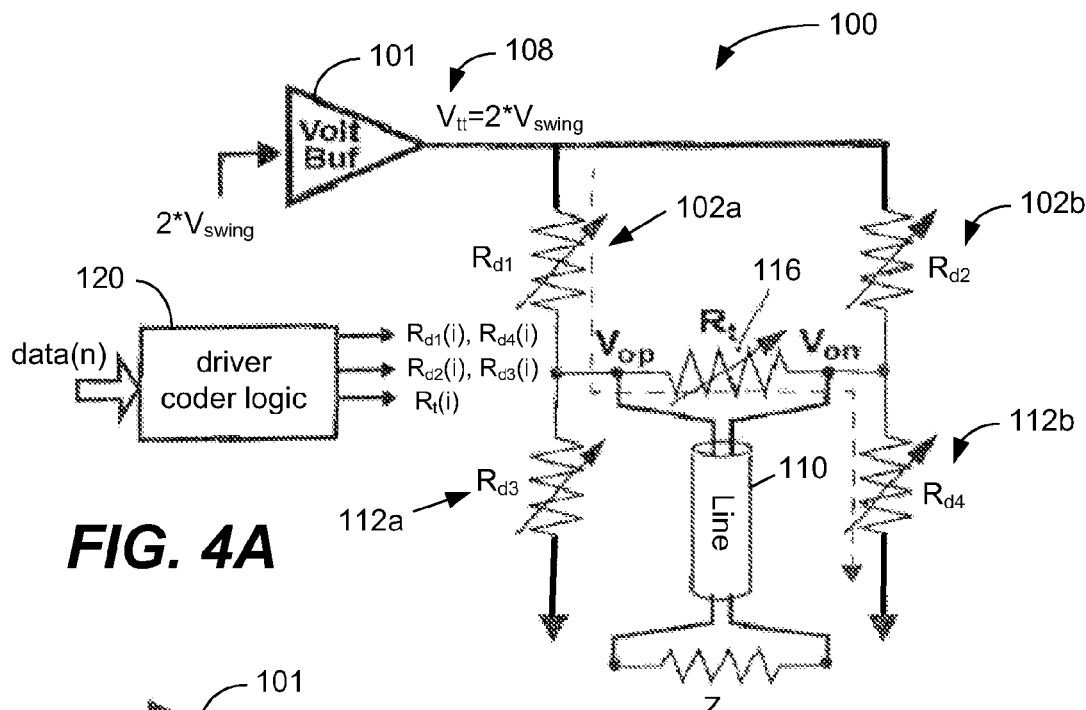
FIG. 4A illustrates one implementation of a variable-resistor multi-level line driver in accordance with the present invention.
Figure 4B:
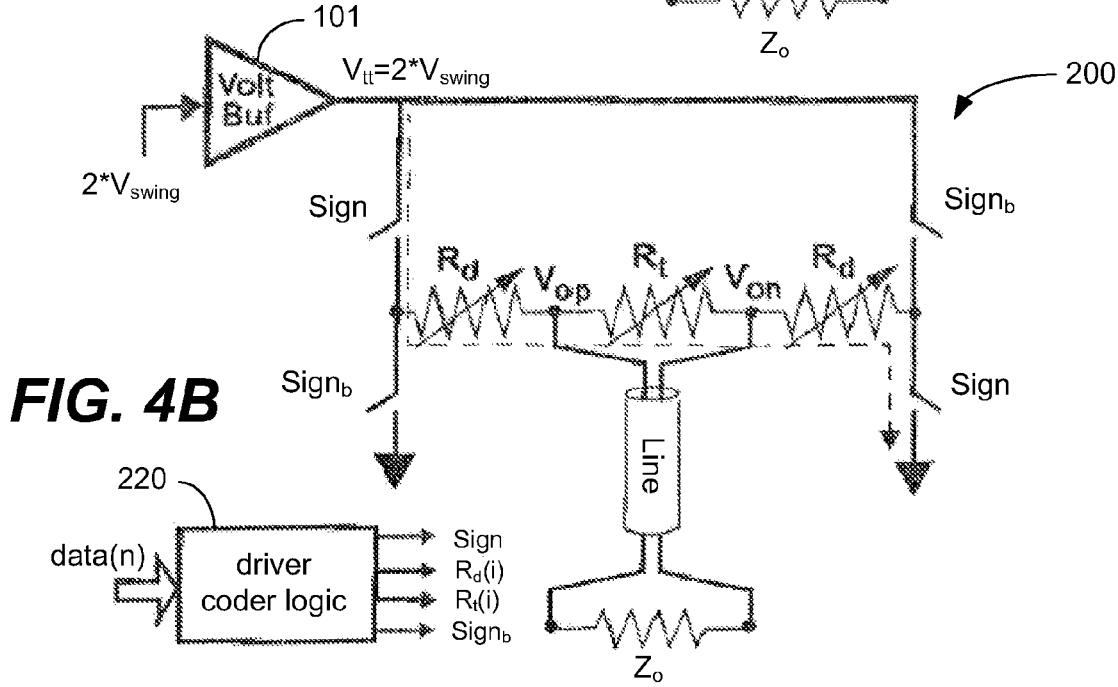
FIG. 4B illustrates another implementation of a variable-resistor multi-level line driver in accordance with the present invention.

FIGS. 4A and 4B respectively illustrate two implementations of a variable-resistor line driver circuit in accordance with the present invention. In one implementation, both implementations have the capability to generate a continuous range of output signal swings, while maintaining an effective impedance equal to a line differential impedance, $Z_o$. The two implementations shown in FIGS. 4A and 4B differ in the way the resistor pull up and pull down switching is performed.

The line driver circuit 100 of FIG. 4A comprises two pull-up variable resistors $R_{d1}$ 102a, $R_{d2}$ 102b respectively connected between a voltage source $V_{tt}$ 108 and output nodes Vop, Von of an output line 110. The line driver circuit 100 further includes two pull-down variable resistors $R_{d3}$ 112a, $R_{d4}$ 112b respectively connected between ground (or negative supply) and the output nodes Vop, Von. In one implementation, the line driver circuit 100 further includes a floating variable resistor $R_t$ 116 connected across the output nodes Vop, Von. In one implementation, the line driver circuit 100 does not include switches that are implemented between the output nodes Vop, Von and either of the voltage source $V_{tt}$ 108 or ground. Instead, the line driver circuit 500 relies on setting each of the impedances of the two pull-up variable resistors $R_d$ 502a, 502b and the two pull-down variable resistors 512a, 512b to a high value—for example, infinity. That is, when a given pull-up resistor (or pull-down resistor) has a value of infinity, no current flows through the resistor to simulate the opening of a switch.

The line driver circuit 200 of FIG. 4B has a similar topology to that shown in FIG. 4A, but the line driver circuit 200 shares the variable resistor for both the pull-up and pull-down paths. In particular, the line driver circuit 200 of FIG. 4 includes a first switch connected between a first power supply and a first node; a second switch connected between the first power supply and a second node; a third switch connected between the first node and a second power supply; a fourth switch connected between the second node and the second power supply; a first variable resistor connected between the first node and the first output terminal; a second variable resistor connected between the second node and the second output terminal; a floating variable resistor connected between the first output terminal and the second output terminal. By such a sharing, the switching node driver 200 saves two variable resistors, and at the same time reduces an effective RC introduced to the output node as a result of reduced switch capacitances.

On the other hand, the line driver circuit 100 can generate an output voltage having a controlled common-mode voltage if the pull-up and pull-down resistors are set differently. Each of the line driver circuits 100 and 200 converts a group of n data bits (data(n)) into an output voltage level at a fixed output impedance. In one implementation, a driver coder logic 120 and a driver coder logic 220 digitally sets the values of the variable resistors within the line driver circuits 100 and 200. With regard to FIG. 4A, the driver coder logic 120 digitally sets the pull-up resistor $R_{d1}$ 102a and the pull-down resistor $R_{d4}$ 112b to a same value (e.g., infinity to simulate an open switch), and digitally sets the pull-up resistor $R_{d2}$ 102b and the pull-down resistor $R_{d3}$ 112a to a same value (e.g., infinity to simulate an open switch). In one implementation, each driver coder logic 120, 220 also sets the sign of the output voltage based on a digital data value. In one implementation, a voltage buffer 101 regulates the top rail voltage $V_{tt}$ of the driver structure to twice of the maximum signal swing ($V_{swing}$) expected.

The goal is to produce and launch a voltage into the line, positive or negative, whose amplitude is adjustable from zero to $V_{swing}$, and the driver's power/current consumption reduces with the output swing. To explain the operation of the cell, the following example is used. Consider launching a positive signal—i.e., $V_{swing} > V_{op} - V_{on} > 0$—into the line. In this case, with respect to FIG. 4A, the pull-up resistor $R_{d2}$ 102b and the pull-down resistor $R_{d3}$ 112a are set to a value of infinity, and in the line driver circuit of FIG. 4b, the sign signal (Sign) is high and the signal (Sign$_b$) is low. The current path is shown as dotted lines in FIGS. 4A and 4B. The voltage across the output line is the result of voltage division over three resistors, the two switched resistors $R_d$ in the path and the parallel of $R_t$ and the line impedance $Z_o$. So for $V_{out}$ we have:

$$V_{out} = 2V_{swing} * \frac{Z_o \| R_t}{2R_d + Z_o \| R_t} \qquad (eq.\ 1)$$

So by varying the two resistors in the line driver, $R_d$ and $R_t$, the output voltage is adjustable from $V_{out}=0$ where $R_d$=Infinite and $R_t=Z_o$, and $V_{out}=V_{swing}$, where $R_d=Z_o/2$ and $R_t$=Infinite. However, the two resistors at the same time must ensure an effective output impedance equal to that of the line impedance, so we have:

$$(R_d + R_d) \| R_t = Z_o \qquad (eq.\ 2)$$

Solving for $R_t$ we have:

$$R_t = \frac{R_d * Z_o}{R_d - Z_o/2} \qquad (eq.\ 3)$$

The above equation shows that the minimum value for $R_d$ is $Z_{d2}$ and the minimum value for $R_t$ is $Z_o$. The current compensation of this driver to launch a swing of $V_{out}$ into the line is:

$$I_{drive} = \frac{2V_{swing}}{2R_d + R_t \| Z_o} \qquad (eq.\ 4)$$

where $R_d$ and $R_t$ are calculated based on equations (1) and (2) for a given $V_{out}$. For example, to have the maximum output swing of $V_{out}=V_{swing}$ and for a line impedance of $Z_o=100\Omega$, we have $R_d=50\Omega$ and $R_t$=Infinite, leading to a maximum current consumption of:

$$I_{max} = \frac{V_{swing}}{100\Omega} \qquad (eq.\ 5)$$

This drive current also scales down with lower output voltage, although not linearly, for example for the same above line impedance (but a swing of $V_{out}=V_{swing}/2$), we have $R_d=100\Omega$ and $R_t=200\Omega$, and thus:

$$I_{max} = \frac{V_{swing}}{133\Omega} \qquad (eq.\ 6)$$

So for a maximum swing of $V_{swing}=1V$ (or 2V differential peak-to-peak) as in 100/1000Base-T, the current consumption for maximum output voltage (2V differential peak-to-peak) is 10 mA, and for half of that output voltage (1V differential peak-to-peak) is 7.5 mA.

Figure 1:
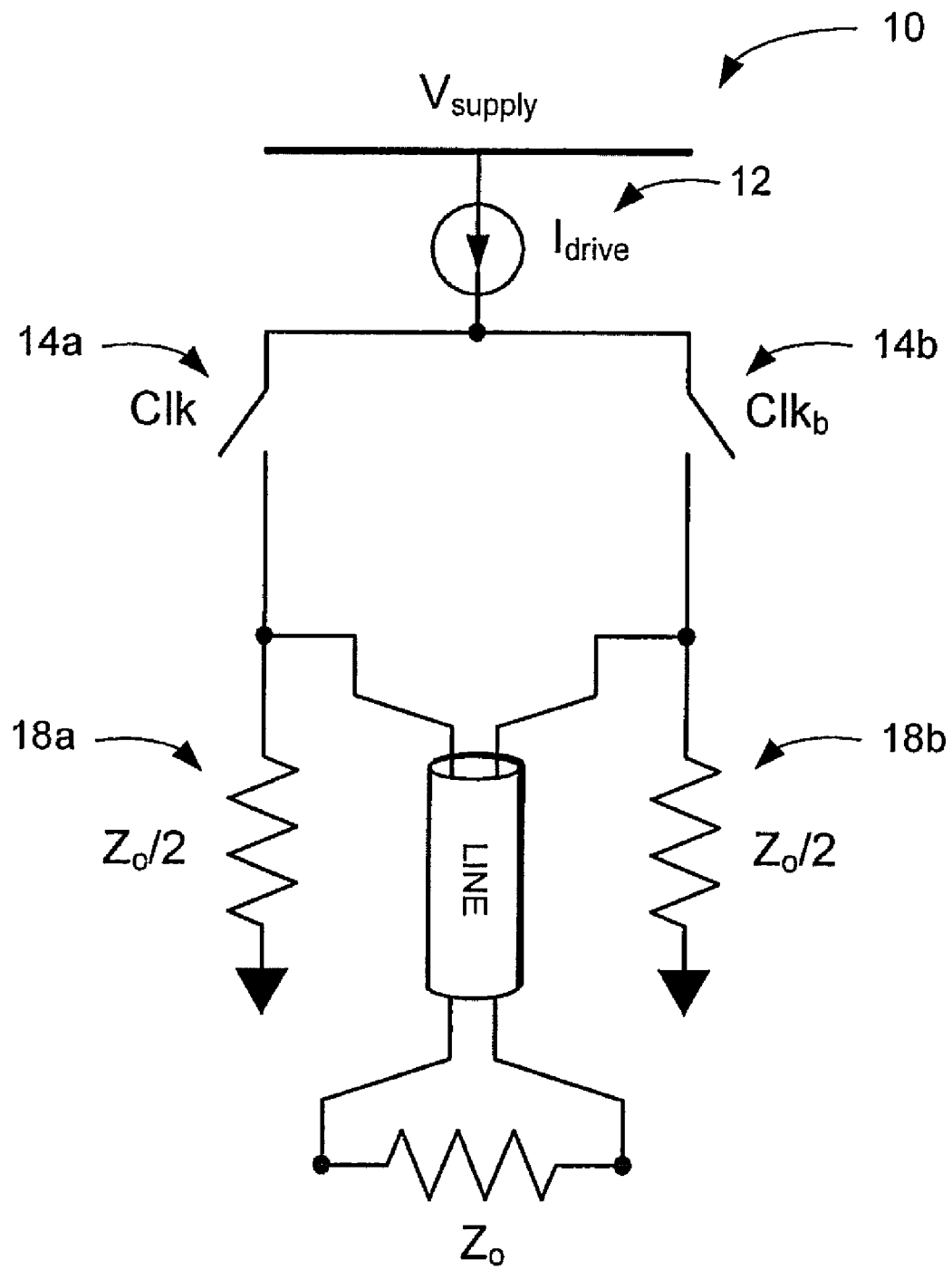
FIG. 1 illustrates a conventional source/emitter-coupled line driver.

The above current numbers compared to a conventional source-coupled (or emitter-coupled) driver of FIG. 1, shows the clear power advantage of the proposed block for providing a given output voltage. For a conventional driver to deliver a max swing of 1V (or 2V differential peak-to-peak) into the line, the driver current must be four times that of the inventive design:

$$I_{drive} = \frac{V_{swing}}{Z_o/4} = 4 * \frac{V_{swing}}{Z_o} \qquad (eq.\ 7)$$

Figure 2:
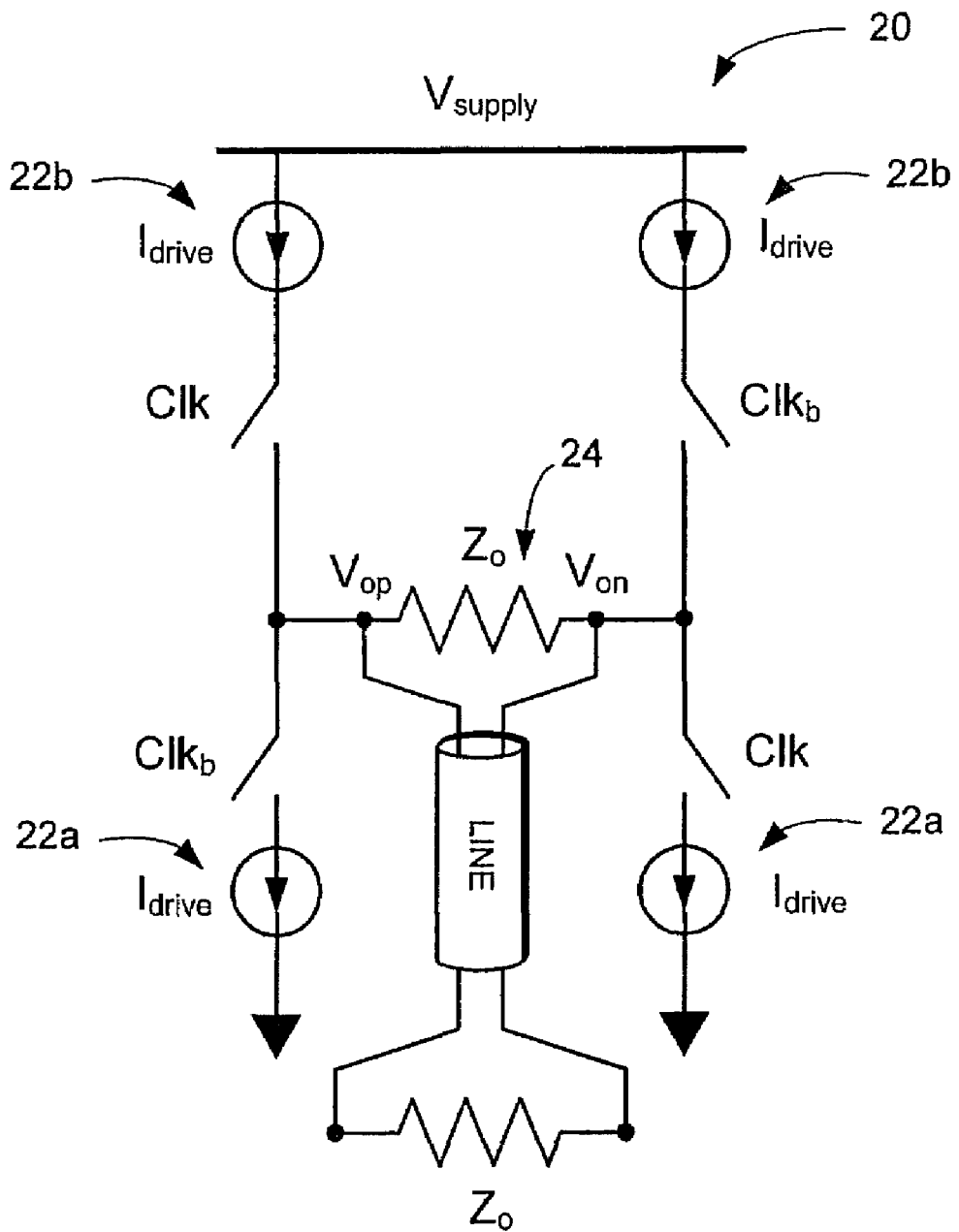
FIG. 2 illustrates a conventional H-bridge push-pull line driver
Figure 3:
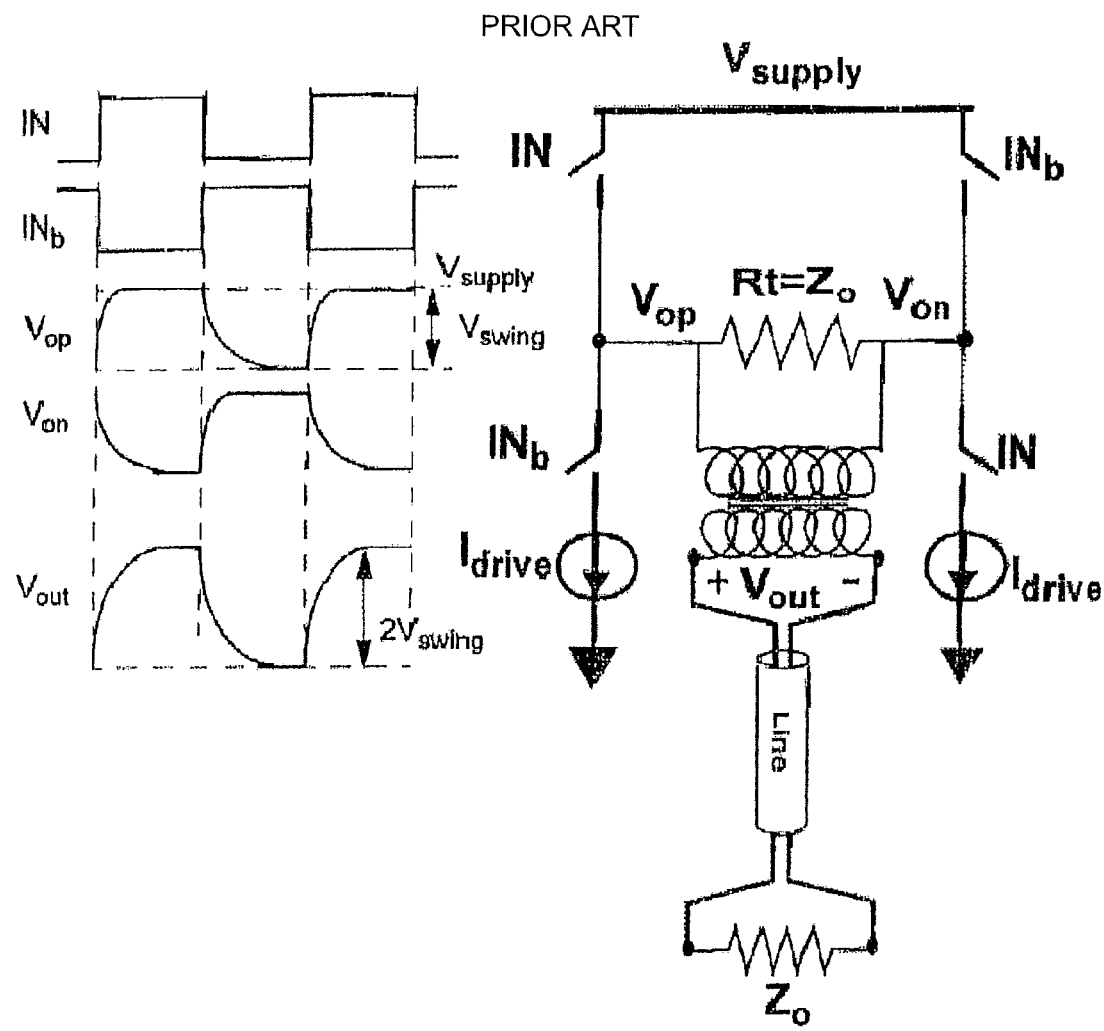
FIG. 3 illustrates a modified H-bridge line driver for low-voltage operation.

The inventive design also has a power advantage over other lower power designs such as the H-bridge line driver shown in FIG. 2. As the H-bridge driver both sources and sinks current at the same time, the current efficiency of the H-bridge driver is twice that of the conventional source-coupled design, but the H-bridge driver has a current efficiency that is still almost half that of the inventive design. To repeat the above example again, for delivering a max swing of 1V (or 2V differential peak-to-peak) into the line, the driver current must be two times that of the inventive design:

$$I_{drive} = \frac{V_{swing}}{Z_o/2} = 2 * \frac{V_{swing}}{Z_o} \qquad (eq.\ 8)$$

However, in the H-bridge design to keep the current sources in saturation, the H-bridge design requires twice the headroom of a conventional source-coupled design for the current source devices, thus typically requiring a higher supply voltage. The inventive design does not suffer from this drawback either as the resistors do not require any headroom at all to preserve their value and thus source or sink the correct current.

In one implementation, an advantage of the line driver in accordance with the present invention is the fact that the current driven into the link does not vary as a result of large variations of the line voltage. The other above-mentioned conventional designs (which require current source devices) are subject to channel length modulation for the output current as a result of large output voltage variations. This property of the inventive design is applicable for applications (e.g., 1000Base-T) that use bidirectional signaling, where the output voltage is super-imposed by an incoming signal that can be as large as 2V differential peak-to-peak by itself, resulting in up to 4V differential peak-to-peak swing (or 2V swing on either side).

In one implementation, one advantage of the proposed driver design in the line driver circuit of FIG. 4A is that the output common mode of the driver can be adjusted by having different pull-up and pull-down resistors. So as long as the differential impedance of the stage stays the same, meaning:

$$(R_{dup} + R_{ddown}) \| R_t = Z_o \qquad (eq.\ 9)$$

the common-mode signal component can be shifted to a higher or lower voltage than half the regulated voltage. Such a common-mode shift comes at no trade off in this driver, but results in a rather considerable trade off in the conventional drivers. In the source/emitter coupled driver, common-mode shift results in more power consumption proportional to the common-mode shift. In the H-bridge driver, common-mode shift increases the headroom requirement or in some cases may not leave enough headroom for the current sources to operate properly.

In one implementation, due to the flexibility of the inventive design, the regulated supply is restricted to twice the voltage swing level at the minimum, but there is no limitation on its maximum value. As an option, to do without an extra regulated power supply for the driver, one can simply use an off-chip supply that is rated to be always higher than twice the required output swing. For example to support an output swing of 1V single-ended, one can use a 2.5V supply, that may go as low as 10% lower due to voltage tolerances and IR drops, and still attain a required output swing and termination by proper choice of resistor values in the driver.

Advantages

1. Almost 75% less power compared to the conventional source-coupled (emitter-coupled) line driver, and 50% less power compared to the H-bridge driver.

2. Does not require a high supply voltage as there is not much headroom requirement by the resistor structure. What limits the minimum required supply voltage for a certain output swing is ensuring the effective output impedance of the driver is equal to the line impedance for a required output swing.

3. The driver supply voltage can assume a range of values for a given output swing above the minimum required supply (minimum being $2*V_{swing}$) by proper choice of resistor values in the driver branches.

4. Since the inventive design is not a current source driver, the inventive design does not suffer from channel length modulation, which results in output current modulation as a result of large voltage variations at the output.

5. Adjustable output common-mode voltage at no trade off for extra power or headroom requirement.

Although the present invention has been described in accordance with the implementations shown, modifications can be made to the implementations and those variations would be within the and scope of the present invention.

What is claimed is:

1. A line driver circuit including a first output terminal and a second output terminal, the line driver circuit comprising:
    a first pull-up variable resistor directly connected between a first power supply and the first output terminal;
    a second pull-up variable resistor directly connected between the first power supply and the second output terminal;
    a first pull-down variable resistor directly connected between a second power supply and the first output terminal;
    a second pull-down variable resistor directly connected between the second power supply and the second output terminal;
    a floating variable resistor connected between the first output terminal and the second output terminal; and
    coder logic to receive data bits and adjust an output voltage across the first output terminal and the second output terminal by varying resistances of the floating variable resistor, the first pull-up variable resistor, the second pull-up variable resistor, the first pull-down variable resistor, and the second pull-down variable resistor to provide amplitude modulation of the output voltage across the first output terminal and the second output terminal responsive to the received data bits and at a fixed regulated voltage of a power supply,
    wherein an effective parallel resistance value of the first pull-up variable resistor, the second pull-up variable resistor, the first pull-down variable resistor, the second pull-down variable resistor, and the floating variable resistor coupled together is fixed to maintain an effective output impedance for the line driver circuit that equals an impedance of a transmission line connected to the first output terminal and the second output terminal.

2. The line driver circuit of claim 1, wherein the coder logic is further operable to set the resistance of the first pull-up variable resistor and the second pull-up variable resistor to a value that is different from the resistance of the first pull-down variable resistor and the second pull-down variable resistor to generate a controlled common-mode voltage associated with the adjustable output voltage.

3. The line driver circuit of claim 1, further comprising a voltage regulator to regulate a voltage of the first power supply to twice a maximum signal swing of the adjustable output voltage.

4. The line driver circuit of claim 3, wherein the adjustable output voltage is adjustable from zero to the maximum signal swing.

5. The line driver circuit of claim 4, wherein power consumption of the line driver circuit is directly proportional to the adjustable output voltage.

6. The line driver circuit of claim 5, wherein a drive current associated with the line driver circuit is directly proportional to the adjustable output voltage.

7. The line driver circuit of claim 1, wherein the line driver circuit is a multi-level pulse amplitude modulation (PAM) line driver circuit.

8. The line driver circuit of claim 7, wherein the multi-level pulse amplitude modulation (PAM) line driver circuit is compliant with 100Base-T or 1000Base-T protocols.

9. A line driver circuit including a first output terminal and a second output terminal, the line driver circuit comprising:
    a first switch directly connected between a first power supply and a first node;
    a second switch directly connected between the first power supply and a second node;
    a third switch directly connected between the first node and a second power supply;
    a fourth switch directly connected between the second node and the second power supply;
    a first variable resistor connected between the first node and the first output terminal;
    a second variable resistor connected between the second node and the second output terminal;
    a floating variable resistor connected between the first output terminal and the second output terminal; and
    coder logic to receive data bits and adjust an output voltage across the first output terminal and the second output terminal by varying resistances of the floating variable resistor, the first variable resistor, and the second variable resistor to provide amplitude modulation of the output voltage across the first output terminal and the second output terminal responsive to the received data bits and at a fixed regulated voltage of a power supply,
    wherein an effective parallel resistance value of the first variable resistor, the second variable resistor, and the floating variable resistor coupled together is fixed to maintain an effective output impedance for the line driver circuit that equals an impedance of a transmission line connected to the first output terminal and the second output terminal.

10. The line driver circuit of claim 9, further comprising a voltage regulator to regulate a voltage of the power supply to twice a maximum signal swing of the adjustable output voltage.

11. The line driver circuit of claim 10, wherein the adjustable output voltage is adjustable from zero to the maximum signal swing.

12. The line driver circuit of claim 11, wherein power consumption of the line driver circuit is directly proportional to the adjustable output voltage.

13. The line driver circuit of claim 12, wherein a drive current associated with the line driver circuit is directly proportional to the adjustable output voltage.

14. The line driver circuit of claim 12, wherein the coder logic is operable to digitally set the resistance of each of the floating variable resistor, the first variable resistor, and the second variable resistor to provide the amplitude modulation and the effective parallel resistance value.

15. The line driver circuit of claim 9, wherein the line driver circuit is a multi-level pulse amplitude modulation (PAM) line driver circuit.

16. The line driver circuit of claim 15, wherein the multi-level pulse amplitude modulation (PAM) line driver circuit is compliant with 100Base-T or 1000Base-T protocols.

17. The line driver circuit of claim 1 wherein the amplitude modulation provided by the coder logic is multi-level amplitude modulation providing more than two voltage levels.

18. The line driver circuit of claim 9 wherein the amplitude modulation provided by the coder logic is multi-level amplitude modulation providing more than two voltage levels.

\* \* \* \* \*